US006626364B2

(12) United States Patent
Taban

(10) Patent No.: US 6,626,364 B2
(45) Date of Patent: Sep. 30, 2003

(54) HIGH SPEED SYSTEM FOR EMBEDDING WIRE ANTENNAS IN AN ARRAY OF SMART CARDS

(75) Inventor: Vahid Taban, Chino Hills, CA (US)

(73) Assignee: Tandis, Inc., Anaheim, CA (US)

( * ) Notice: Subject to any disclaimer, the term of this patent is extended or adjusted under 35 U.S.C. 154(b) by 0 days.

(21) Appl. No.: 10/349,138

(22) Filed: Jan. 23, 2003

(65) Prior Publication Data

US 2003/0116635 A1 Jun. 26, 2003

Related U.S. Application Data

(63) Continuation of application No. 09/973,099, filed on Oct. 9, 2001, now abandoned.

(51) Int. Cl.[7] .............................................. G06K 19/06
(52) U.S. Cl. ...................................... 235/492; 235/487
(58) Field of Search ................................ 235/487, 492; 361/737

(56) References Cited

U.S. PATENT DOCUMENTS 6,404,643 B1 * 6/2002 Chung ........................ 235/492

* cited by examiner

Primary Examiner—Harold I. Pitts
(74) Attorney, Agent, or Firm—Morland C. Fischer

(57) ABSTRACT

A high speed system for embedding antenna wire within a non-conductive (e.g. plastic) sheet on which electronic chips are mounted for manufacturing a plurality of smart cards, or the like. The antenna wire is installed in the non-conductive sheet by an ultrasonic actuator that is moved up and down relative to the sheet. The movement of the actuator relative to the substrate is controlled by the interaction between a stationary voicecoil magnet and a voicecoil that is coupled to the ultrasonic actuator and moveable with the slide assembly. Antenna wire is fed to the ultrasonic actuator from an antenna wire dispensing spool via an idler assembly. The idler assembly includes an encoder which is responsive to an increase in tension in the antenna wire feed line. Depending upon the output of the encoder, the speed and rotation of the wire dispensing spool is controlled until the tension in the antenna wire feed line is eliminated.

24 Claims, 15 Drawing Sheets

HIGH SPEED SYSTEM FOR EMBEDDING WIRE ANTENNAS IN AN ARRAY OF SMART CARDS

This patent application is a continuation of application Ser. No. 09/973,099 filed Oct. 9, 2001 now abandonded.

BACKGROUND OF THE INVENTION

1. Field of the Invention

This invention relates to a system for efficiently manufacturing large numbers of "smart" cards, each card having an electronic chip mounted thereon in which to receive, transmit and store data. The system is adapted to install wire antennas within a plastic sheet so as to lie in communication with the electronic chips of respective smart cards that are formed on the sheet.

2. Background Art

Plastic cards have long been used for the purposes of making credit and debit transactions, operating magnetic locks, providing a means of personal identification, etc. Such cards typically include a permanent magnetic strip on which predetermined information is encoded. However, such permanent magnetic strip is known to wear out over time so as to necessitate a replacement of the card on which the strip is carried. Consequently, the life and application of this type of card is undesirably limited.

What is more, the conventional magnetically encoded cards are passive in nature. That is to say, the information stored on the permanent magnetic strips cannot be changed without issuing an altogether new card. In this same regard, the conventional magnetic strip cards must be placed within or in close proximity to a card reader to be effective. This increases the cost and complexity of a card system like that described above.

To overcome the aforementioned disadvantages of a permanent magnetic strip card, non-contact smart cards have been manufactured that carry one or more electronic chips by which large amounts of information can be transmitted, received and stored. To be effective, such smart cards require an antenna to enable their chips to communicate with external data transmitters/receivers without using a card reader. In this case, the card carries no on-board source of power, and a radio frequency energy source is used to excite the antenna to activate the chips to enable the reading, writing and storage of data.

Unfortunately, the apparatus for installing antennas in the smart cards is slow, cumbersome and generally inefficient. More particularly, motor driven machines have been commonly used to attach the antennas to the cards. These machines are characterized by many gears and shafts which often results in increased tension within the antenna feed line and, therefore, breaking the feed line and/or jamming of the machines. Consequently, the machines are subject to frequent repairs and down time and, accordingly, are not ideally suited for manufacturing large numbers of cards on which a corresponding large number of antennas must be installed in a relatively short time.

SUMMARY OF THE INVENTION

A high speed system is described by which copper antenna wires are embedded within an array of smart cards that are manufactured on a plastic sheet so as to lie in electrical contact with electronic chips that are mounted on respective cards. The system includes a slide assembly that carries an ultrasonic actuator. The tip of the ultrasonic actuator is connected to receive a supply of ultrasonic energy for melting a plastic card to form a path in which an antenna wire is to be embedded. There is a channel formed in the tip of the ultrasonic actuator through which a run of the antenna wire is fed so that an antenna may be installed at high speed directly within the path burned in the card.

The slide assembly is adapted to reciprocate to correspondingly move the ultrasonic actuator in up and down directions relative to the plastic sheet so as to be repositioned from card-to-card of the array thereof. The slide assembly includes a voicecoil that receives a DC current. The voicecoil is arranged in spaced alignment with a stationary voicecoil magnet. Depending upon the direction of the DC current received by the voicecoil, the slide assembly and the ultrasonic actuator carried thereby will move in a downward direction towards the plastic sheet of cards when the polarities of the voicecoil and the stationary voicecoil magnet are opposite. The slide assembly and the ultrasonic actuator carried thereby will then move in an upward direction away from the plastic sheet of cards when the polarities of the voicecoil and the stationary voicecoil magnet are identical.

Antenna wire is delivered along a wire feed path from a wire dispensing spool to the tip of the ultrasonic actuator via an idler assembly that smoothes the delivery of the wire and a solenoid actuated clamping assembly that holds the wire to be embedded within a plastic card. The speed and direction in which the wire dispensing spool is rotated is controlled by a spool motor. A spool motor shaft encoder is coupled to the shaft of the spool motor to provide an indication of the speed and direction in which the wire dispensing spool is rotated.

The idler assembly located between the wire dispensing spool and the ultrasonic actuator includes a plurality of idler wheels over which the antenna wire is wound. The idler wheels feed the antenna wire to a pulley wheel that is rotated by a pulley motor at a constant speed and in a single direction to avoid binding along the antenna wire feed path. The idler assembly includes an idler arm having idler wheels connected at opposite ends thereof. The idler arm is caused to rotate in the event that tension increases in the wire feed path. An idler arm encoder is responsive to the rotation of the idler arm as an indication of increasing tension in the antenna wire feed path. The direction and speed of the spool motor and the wire dispensing spool rotated thereby is controlled depending upon the information provided by the spool motor shaft encoder and the idler arm encoder until the tension in the wire feed path is eliminated so as to ensure a high speed, efficient installation of the antenna wires in the array of plastic cards.

BRIEF DESCRIPTION OF THE DRAWINGS

FIG. 4A is an enlarged detail of the tip of the ultrasonic actuator of FIG. 4;

DETAILED DESCRIPTION

Figure 1:
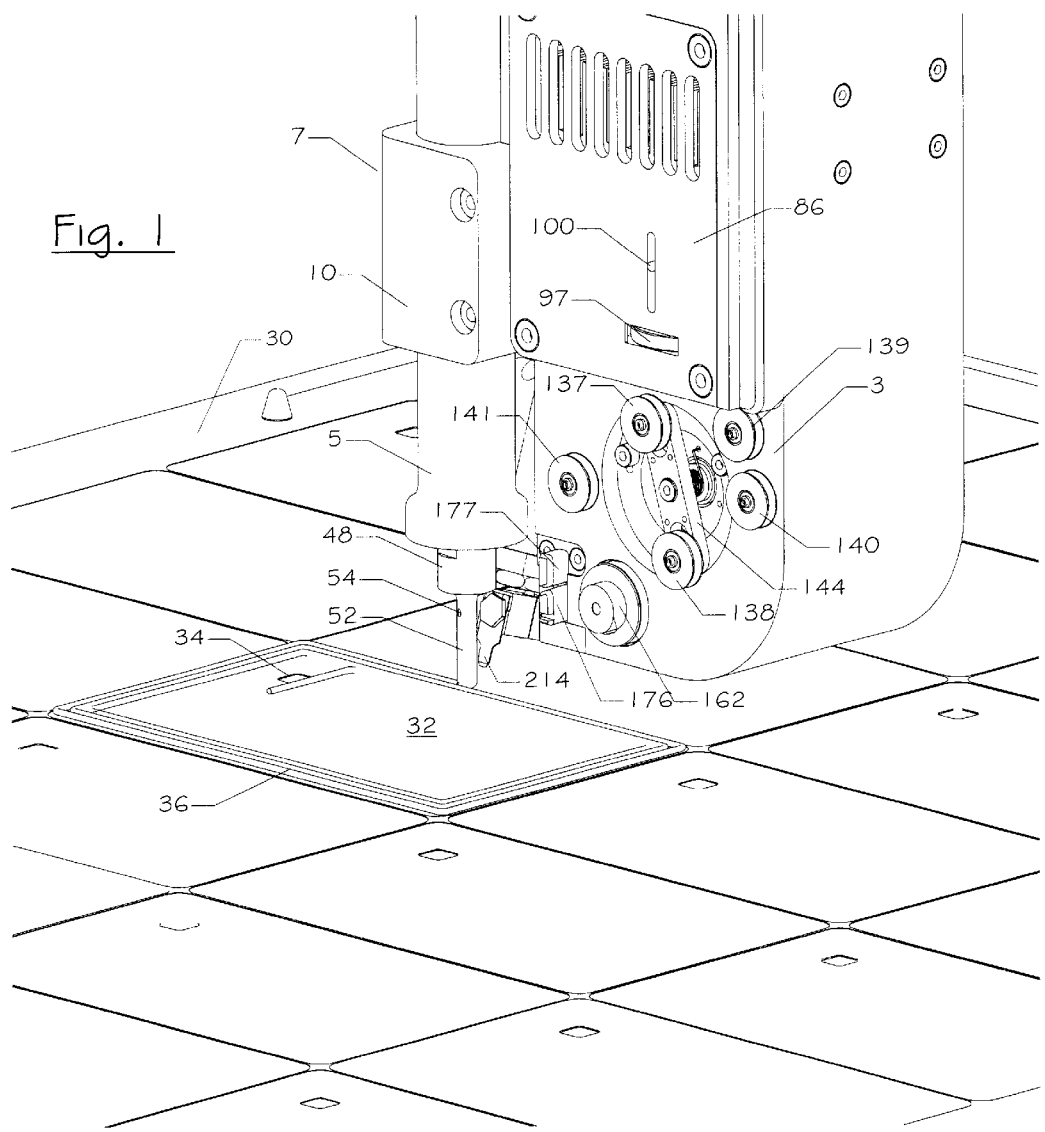
FIG. 1 shows an ultrasonic actuator carried by the antenna wire embedding system of the present invention for installing an antenna wire in a smart card on a plastic sheet of smart cards.
Figure 2:
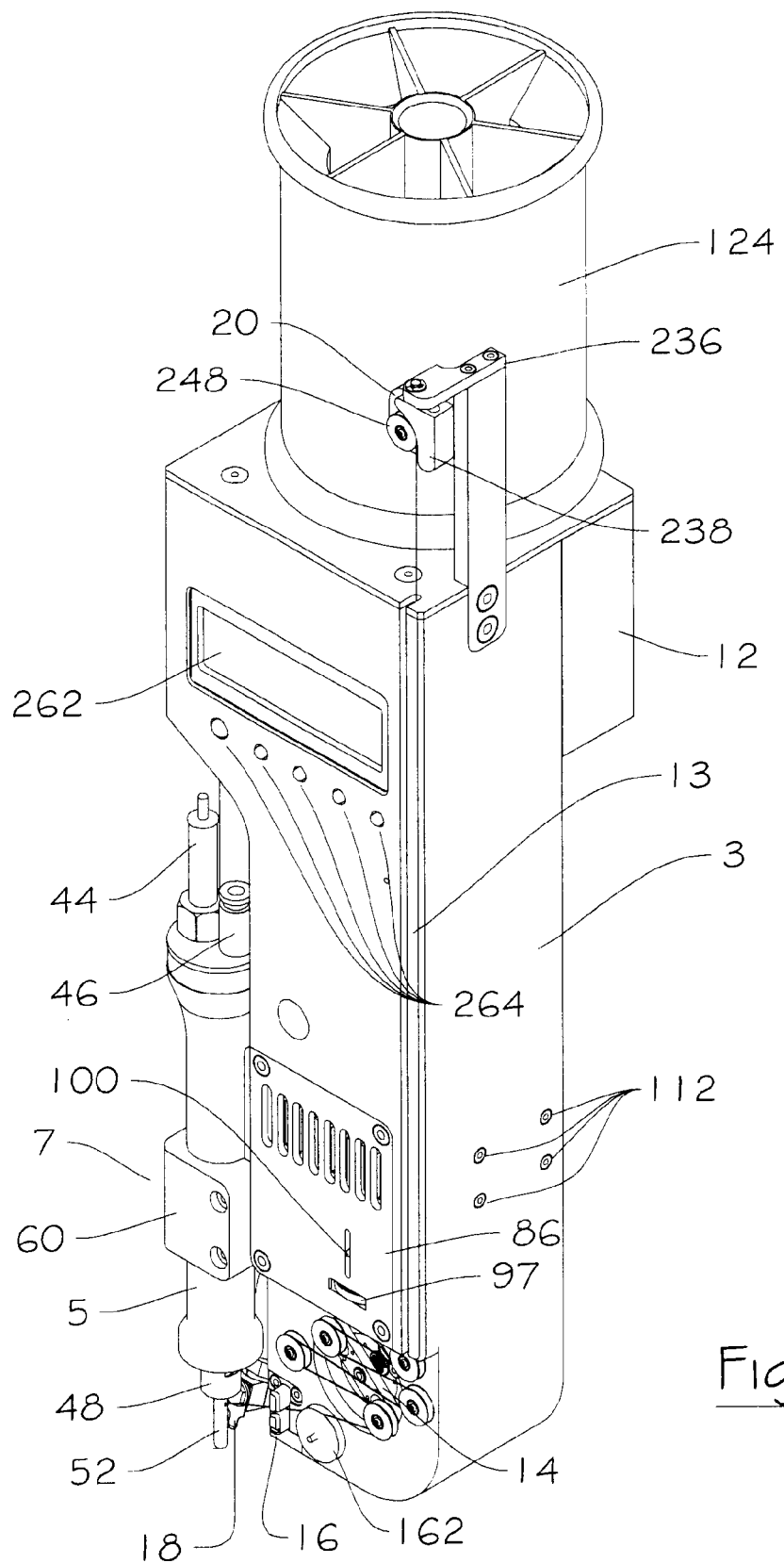
FIG. 2 shows the antenna wire embedding system of FIG. 1 in which the ultrasonic actuator is carried.
Figure 3:
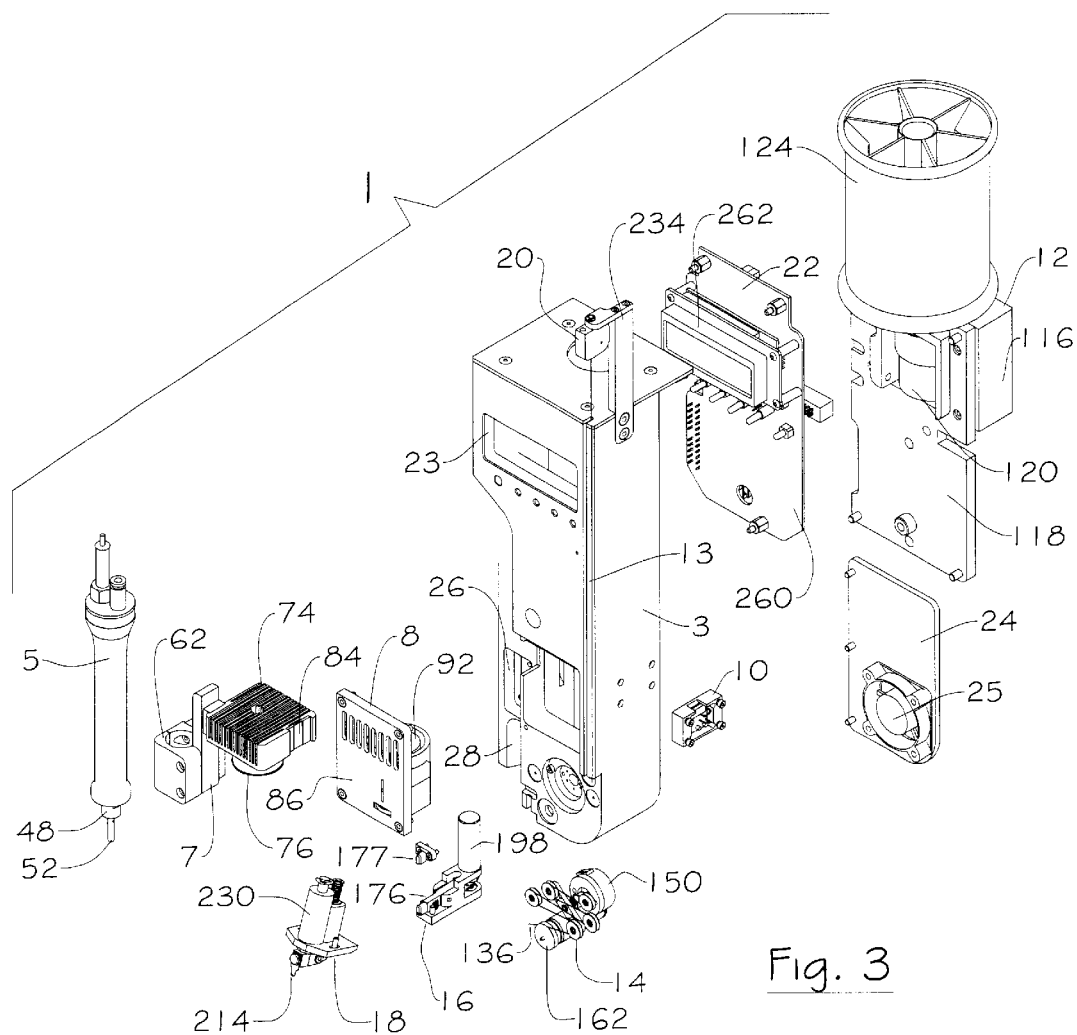
FIG. 3 is an exploded view showing the components that form the antenna wire embedding system of this invention.

An overview of the system 1 for embedding wire antennas in a plastic sheet from which a plurality of "smart" cards are cut is provided while referring concurrently to FIGS. 1–3 of the drawings. FIG. 1 shows a plastic (e.g. PVC) sheet 30 in which the boundaries for an array of smart cards 32 will be cut. An opening 34 is cut into each smart card 32 to receive an electronic chip (not shown) which is capable of receiving, transmitting and storing data that is unique to a user.

In order to transmit data to and from the electronic chip, a wire antenna 36 that is to lie in electrical contact with the chip is embedded in the plastic and wound around the outer periphery of each smart card 32. Each wire antenna 36 consists of a run of preferably 38 gauge copper wire. The card 32 in which the wire antenna 36 is to be embedded may have any one of a number of different applications, including personal identification cards, credit and debit cards, electronic keys, and the like.

By virtue of the wire antenna embedding system 1 of this invention, wire antennas (e.g. 36) can be rapidly installed into the plastic sheet 30 at high speed by means of a substantially continuous antenna wire dispensing technique. Thus, the system 1 will be available to meet the demands of business and government, alike, whereby to efficiently manufacture a large number of smart cards 32 in a relatively short time at relatively low cost.

In general terms, the system 1 for embedding the antenna wires 36 into the plastic sheet 30 includes a main housing 3. An ultrasonic actuator 5 (to be described in greater detail when referring to FIG. 4) includes an ultrasonic horn 48 that is adapted to receive the power necessary to melt the plastic sheet 30 to form a path therein in which to receive an antenna wire. The ultrasonic actuator 5 includes a tip 52 (to be described in greater detail when referring to FIG. 4A) from which a run of copper wire 136 (of FIG. 2) is dispensed for installation in the sheet 30 to form the wire antenna 36 for card 32.

A slide assembly 7 (to be described in greater detail when referring to FIG. 5) attaches the ultrasonic actuator 5 to the main housing 3 of system 1. The slide assembly 7 includes a heat sink 74 and a voicecoil 76 which forms an electromagnet. The voicecoil 76 is positioned within an upper compartment 26 (best shown in FIG. 3) of the main housing 3. The slide assembly 7 is adapted to move up and down relative to the main housing 3 so that the ultrasonic actuator 5 that is carried by slide assembly 7 will correspondingly move in the same up and down directions for jumping over the turns of a wire antenna 36 and for moving from card-to-card to install additional wire antennas 36 therein. To this end, the position of the slide assembly 7 is monitored so that position and force feedback information is supplied to the system control circuitry 22 in a manner to be described hereinafter when referring to FIG. 13.

Figure 6:
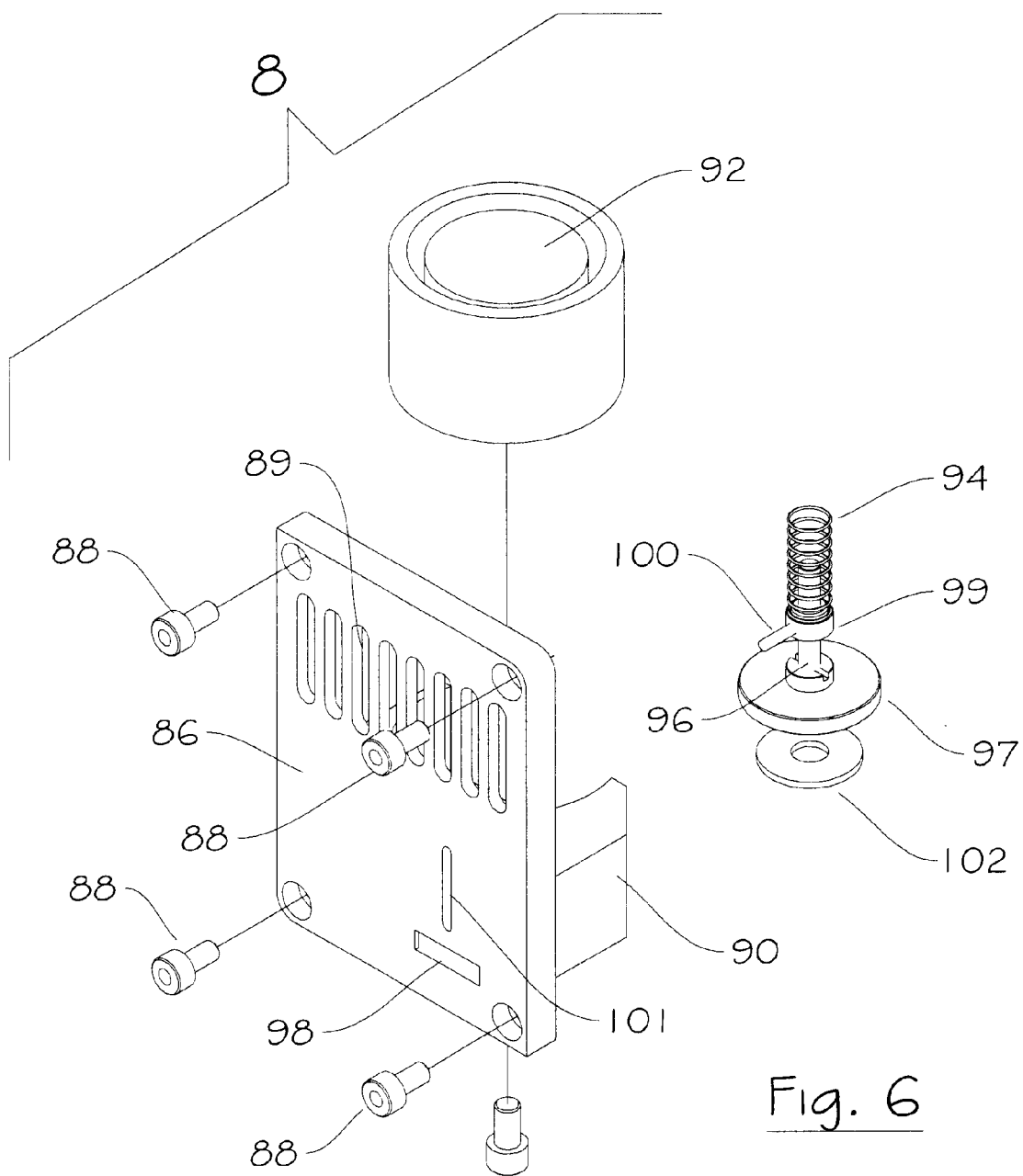
FIG. 6 is an exploded view of a magnet assembly shown in FIG. 3.

The voicecoil 76 of the slide assembly 7 (best shown in FIG. 3) cooperates with a stationary voicecoil magnet 92 from a magnet assembly 8 (to be described in greater detail when referring to FIG. 6). The magnetic effect that is created between the electromagnetic voicecoil 76 and the voicecoil magnet 92 when a DC current is conducted by the voicecoil 76 controls the up and down movement of the slide assembly 7 and the force and position of the ultrasonic actuator 5 carried thereby. The voicecoil magnet 92 is held in place by a magnet mounting plate 83 within a lower compartment 28 (best shown in FIG. 3) of the main housing 3 so as to be positioned directly below the voicecoil 76.

Figure 7:
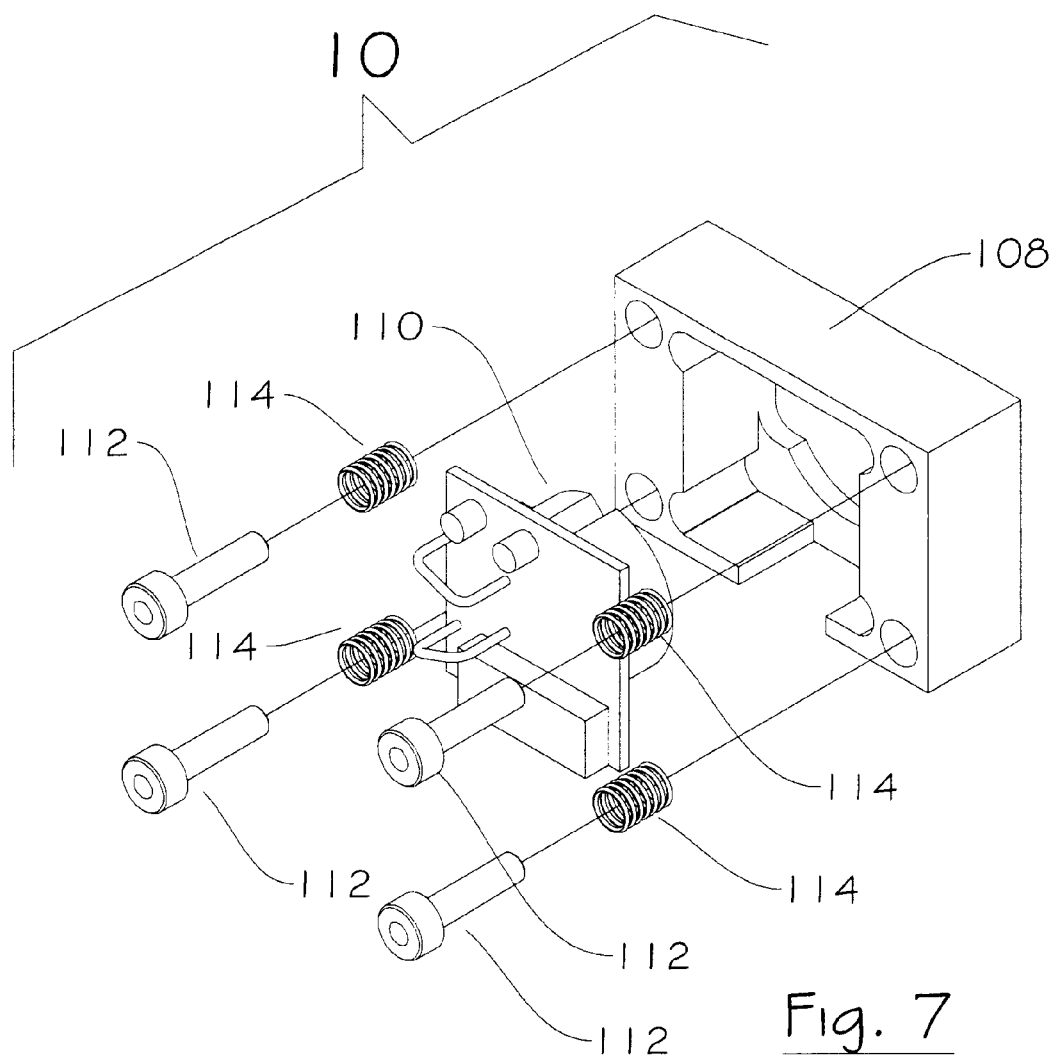
FIG. 7 is an exploded view of an optical reader shown in FIG. 3.

Located within the main housing 3 of system 1 and axially aligned with an optical scale 84 of the slide assembly 7 (also best shown in FIG. 3) is an optical reader 10 (to be described in greater detail when referring to FIG. 7). The optical reader 10 functions as an optical read head to track the up and down movements of the electronic voice coil 76 as well as the ultrasonic actuator 5 which is carried by the slide assembly 7. Position information is provided to the system control circuitry 22 to determine the precise location of the tip 52 of ultrasonic actuator 5 with respect to the plastic sheet 30 in which the wire antennas are to be embedded.

A supply of copper antenna wire 136 (of FIG. 2) is dispensed from a wire spool 124 of a spool assembly 12 (to be described in greater detail when referring to FIG. 8) for receipt by the tip 52 of the ultrasonic actuator 5 by way of an elongated wire guide channel 13 that runs vertically along the main housing 3. The direction and rotational speed of the wire spool 124 to either dispense or retract the antenna wire 136 is controlled by a spool motor 120. The wire spool 124 and the spool motor 120 of spool assembly 12 are held against the main housing 3 by a motor back plate 118. The shaft of motor 120 is coupled to the wire spool 124 by way of a shaft encoder (designated 126 in FIG. 8). The shaft encoder 126 provides information to the system control circuitry 22 regarding the speed and direction in which the wire spool 124 is turning.

In order for a continuous supply of antenna wire 136 to be dispensed from the wire spool 124 to the tip 52 of the ultrasonic actuator 5 to enable a high speed installation of antennas 36 in the plastic sheet 30, the antenna wire 136 must be supplied under nearly zero tension. The foregoing is accomplished by means of a swing/idler assembly 14 (to be described in greater detail when referring to FIGS. 9 and 9A). The swing/idler assembly 14 includes a motor driven pulley idler 162 around which the antenna wire 136 is wrapped. The pulley idler 162 is rotated at a constant speed and in a single direction. The swing/idler assembly 14 also includes an encoder 150 (best shown in FIG. 3) that is responsive to an increase in the tension of the antenna wire 136 that is wrapped around the motor driven pulley idler 162. The encoder 150 of swing/idler assembly 14 cooperates with the shaft encoder 126 of the spool assembly 12 (of FIG. 8) to provide information to the system control circuitry 22, whereby the speed and direction of rotation of the wire spool 124 are adjusted until there is substantially no tension in the feed of wire 136.

Figure 10:
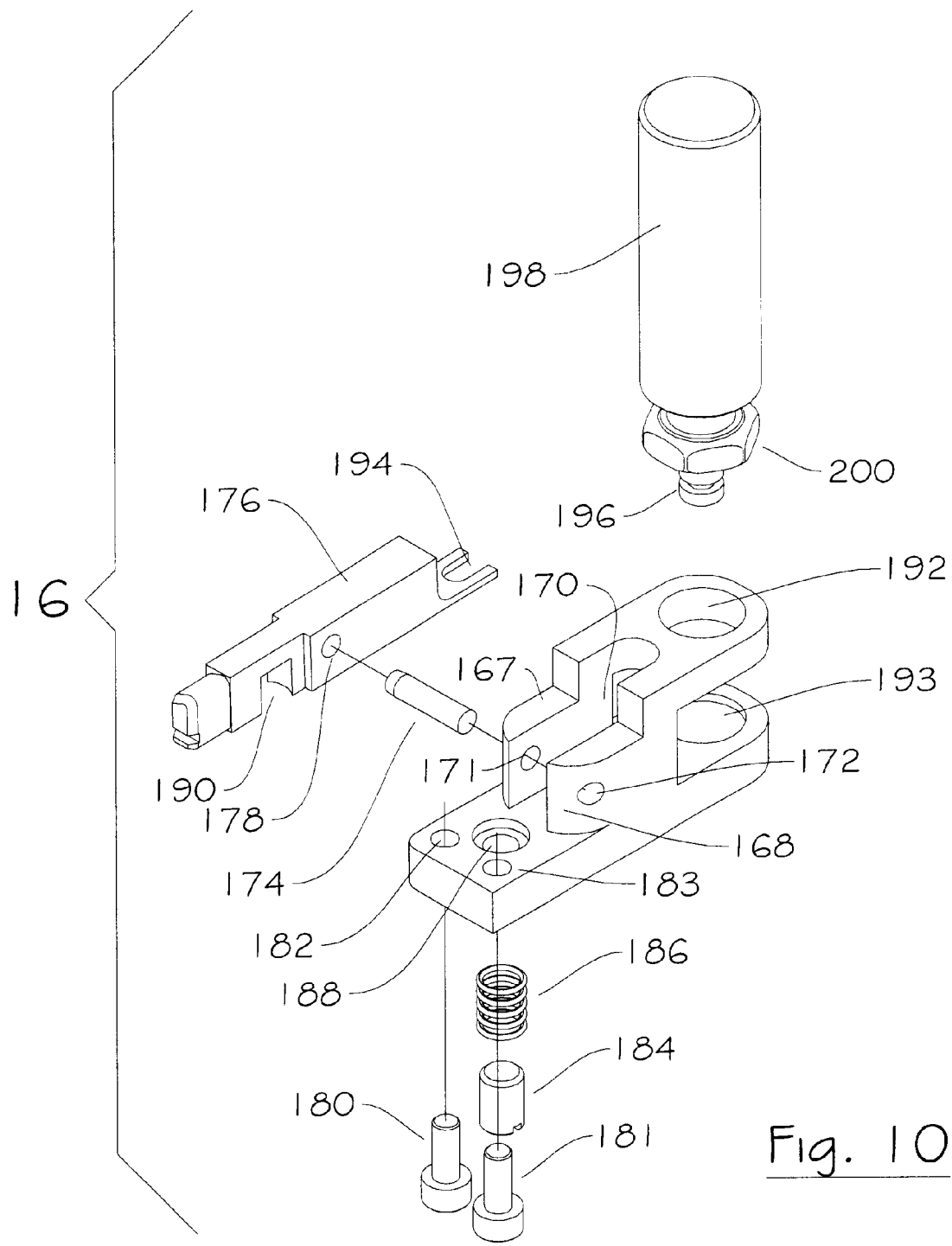
FIG. 10 is an exploded view of a wire clamp assembly shown in FIG. 3.

Antenna wire 136 is fed from the swing/idler assembly 14 to the tip 52 of the ultrasonic actuator 5 by way of a clamp assembly 16 (to be described in greater detail when referring to FIG. 10). The clamp assembly 16 has a solenoid actuated movable jaw 176 that cooperates with a fixed jaw 177 to clamp onto the antenna wire 136 that is being fed out and embedded within a card 32 of plastic sheet 30 until an antenna 36 has been properly installed. At this time, the antenna 36 is cut off the supply to be embedded by the ultrasonic actuator 5 by means of a solenoid actuated cutter assembly 18 (to be described in greater detail when referring to FIG. 11).

Other components of system 1 for embedding a wire antenna 36 include a dancer assembly 20 (to be described in greater detail when referring to FIG. 12) that is suspended above the top of the main housing 3. The dancer assembly 20 guides the antenna wire 136 from the wire spool 124 that sits atop housing 3 into the wire guide channel 13 that runs vertically along the front of housing 3. The dancer assembly 20 is adapted to dampen oscillations so as to enable a smooth and continuous flow of antenna wire 136 over a wire distribution path from the spool 124 to the tip 52 of ultrasonic actuator 5 via wire guide channel 13, swing/idler assembly 14, and the clamp assembly 16.

Attached to the rear of the main housing 3 is a printed circuit board 260 on which the system control circuitry 22 (to be described in greater detail when referring to FIG. 13) is carried. Also carried on the printed circuit board 260 is a digital display 262 that is received through a window 23 at the front of main housing 3. The display 262 is activated by a series of push buttons 264 that are available at the front of the main housing 3 so as to initialize the embedding system 1 and gain access to information regarding the status and operation of the system.

A fan assembly 24 (best shown in FIG. 3) is attached to the rear of the main housing 3 below the printed circuit board 260. The fan assembly 24 includes a fan 25 for cooling the electromagnetic voicecoil 76 of the slide assembly 7 by causing heat to be dissipated through openings 89 in the magnetic mounting plate 86 of the magnet assembly 8 and the heatsink 74 of slide assembly 7.

Figure 4:
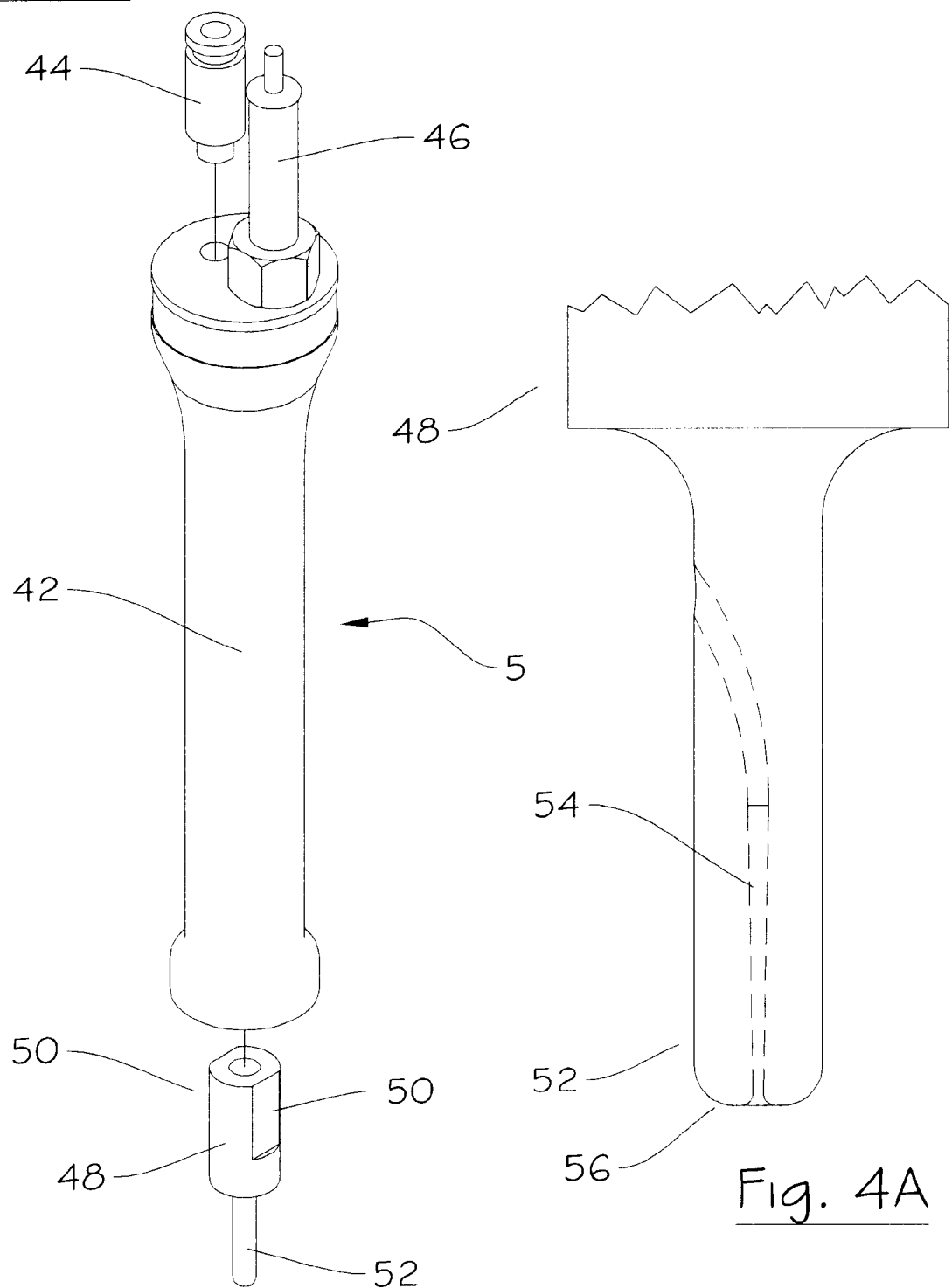
FIG. 4 illustrates the ultrasonic actuator for installing the antenna wire within the smart card of FIG. 1.

The components of the antenna wire embedding system 1 of FIGS. 1–3 for installing wire antennas 36 in the plastic sheet 30 are now described in detail. As was previously described, and as is best shown in FIG. 4, an ultrasonic actuator 5 is carried by and movable with a slide assembly 7 (of FIG. 5). Ultrasonic actuator 5 includes an air cooled body 42. Connected to the top of the body 42 of ultrasonic actuator 5 is a 4 millimeter quick disconnect air fitting 44 that is coupled to a source of air via an air valve (designated 128 in FIG. 8), whereby the ultrasonic actuator 5 may be cooled during high speed operation. Also attached to the top of body 42 is an electrical plug 46 that is coupled to a source of electrical energy by which to excite an ultrasonic horn 48. The horn 48 is manufactured from metal (e.g. titanium) and has a pair of opposing wrench pads 50 by which the horn 48 is detachably connected to the bottom of the body 42. The ultrasonic horn 48 has an elongated tip 52 that projects from the bottom of the ultrasonic actuator 5 and oscillates at an ultrasonic frequency to install the wire antenna within the plastic sheet 30. An ultrasonic actuator, such as that just described, is available from Sonabond Ultrasonics of West Chester, Pa.

As an important feature of the ultrasonic horn 48 of ultrasonic actuator 5, and as is best shown in FIG. 4A of the drawings, the tip 52 has a wire feed tube 54 running therethrough by which antenna wire (designated 136 in FIGS. 1–3) can be fed directly to the plastic sheet 30 into which it is to be embedded to form the wire antennas 36 of FIG. 1. The wire feed tube 54 merges with a concavity 56 around the end of the tip 52 of ultrasonic horn 48, such that the plastic sheet 30 will be melted by the oscillating horn 48 to enable the wire 136 to be quickly and easily embedded at the precise location on a smart card 32. The system 1 of the invention is adapted for high speed operation, in part, by virtue of feeding the antenna wire 136 to the sheet 30 via the wire feed tube 54 that is formed in the tip 52 of ultrasonic horn 48.

Figure 5:
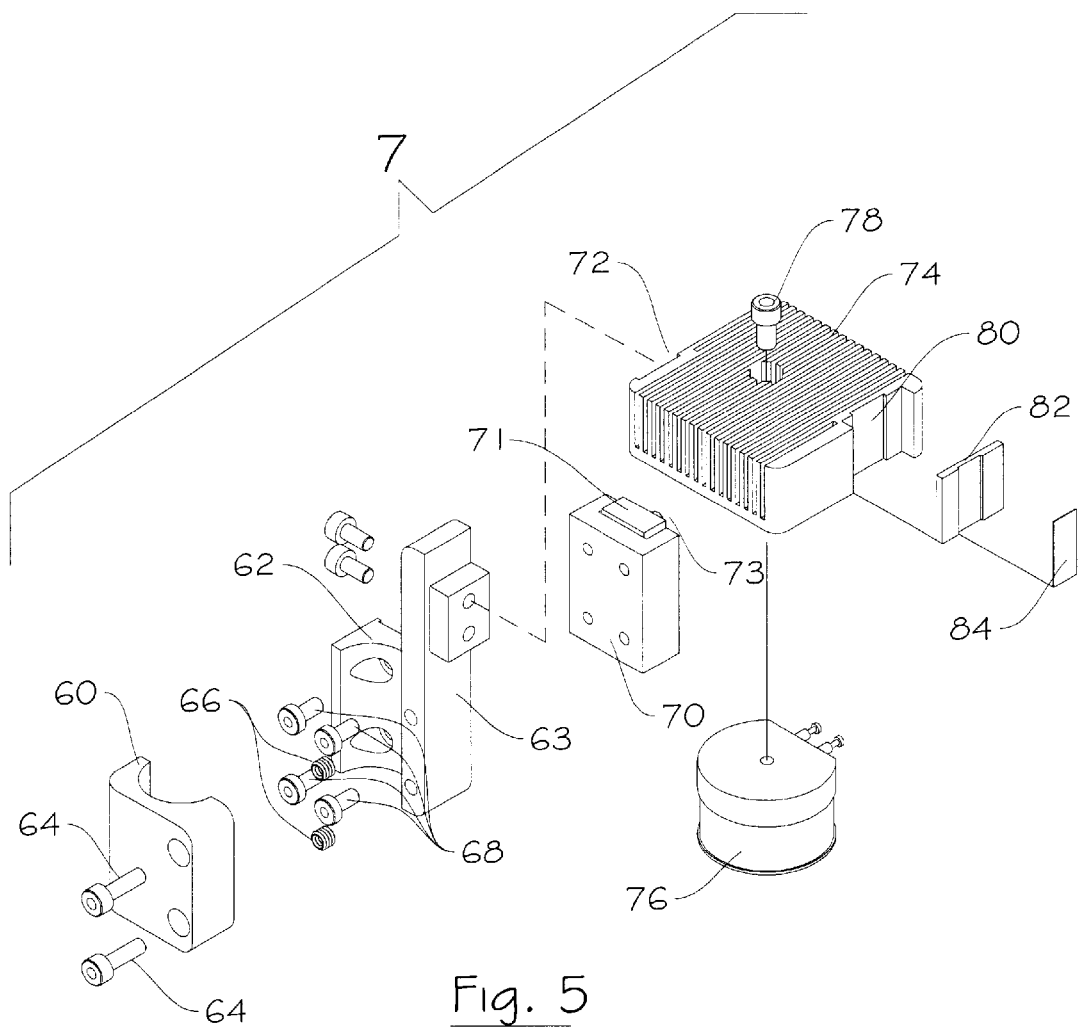
FIG. 5 is an exploded view of a slide assembly shown in FIG. 3.

Details of the slide assembly 7 of the wire antenna embedding system 1 of this invention to retain and transport the ultrasonic actuator 5 are now disclosed while referring to FIG. 5 of the drawings. The slide assembly 7 includes top and bottom clamp shells 60 and 62 between which the ultrasonic actuator 5 (of FIG. 4) is received. A set of fasteners 64 extends through helicoils 66 and holes formed in the top clamp shell 60 and an arm 63 of the bottom clamp shell 62 to hold the clamp shells 60 and 62 together and thereby retain the ultrasonic actuator 5 therebetween (best shown in FIG. 2). Another set of fasteners 68 connects the top and bottom clamp shells 60 and 62 and the ultrasonic actuator 5 carried thereby to a slide 70. The slide 70 is slidably received by and slidable axially along a linear rail 71 (best shown in FIG. 6A). The linear rail 71 is fixedly connected to main housing 3 by means of fasteners 73. The coupling of slide 70 to stationary rail 71 is sometimes known as a cross roller slide assembly.

The arm 63 which carries the connection of the top and bottom clamp shells 60 and 62 is attached within a cavity 72 that is formed in one side of a heatsink 74. As will soon be explained, the slide 70 of slide assembly 7 is adapted to travel reciprocally in up and down directions (i.e. away from and towards the plastic sheet 30 of FIG. 1) along the rail 71 to cause a corresponding displacement of the top and bottom clamp shell 60 and 62 and the ultrasonic actuator 5 that is retained therebetween.

The slide assembly 7 includes heatsink 74 to help dissipate the heat that is generated by the ultrasonic actuator 5 during the high speed antenna wire installation process. A voicecoil 76 is connected to the bottom of the heatsink 74 by means of a suitable fastener 78. A pocket 80 is formed in a side of the heatsink 74 in which to receive an optical mount 82. An optical (e.g. glass) scale 84 is held against the heatsink 74 within the optical mount 82. The optical scale 84 has a series of position lines (not shown) marked thereon by which to provide position feedback information that is read by the optical reader (designated 10 in FIG. 7) to indicate the precise location of the ultrasonic horn 48 of ultrasonic actuator 5 relative to an antenna 36 which has been embedded in a plastic card 32 of sheet 30.

Figure 6A:
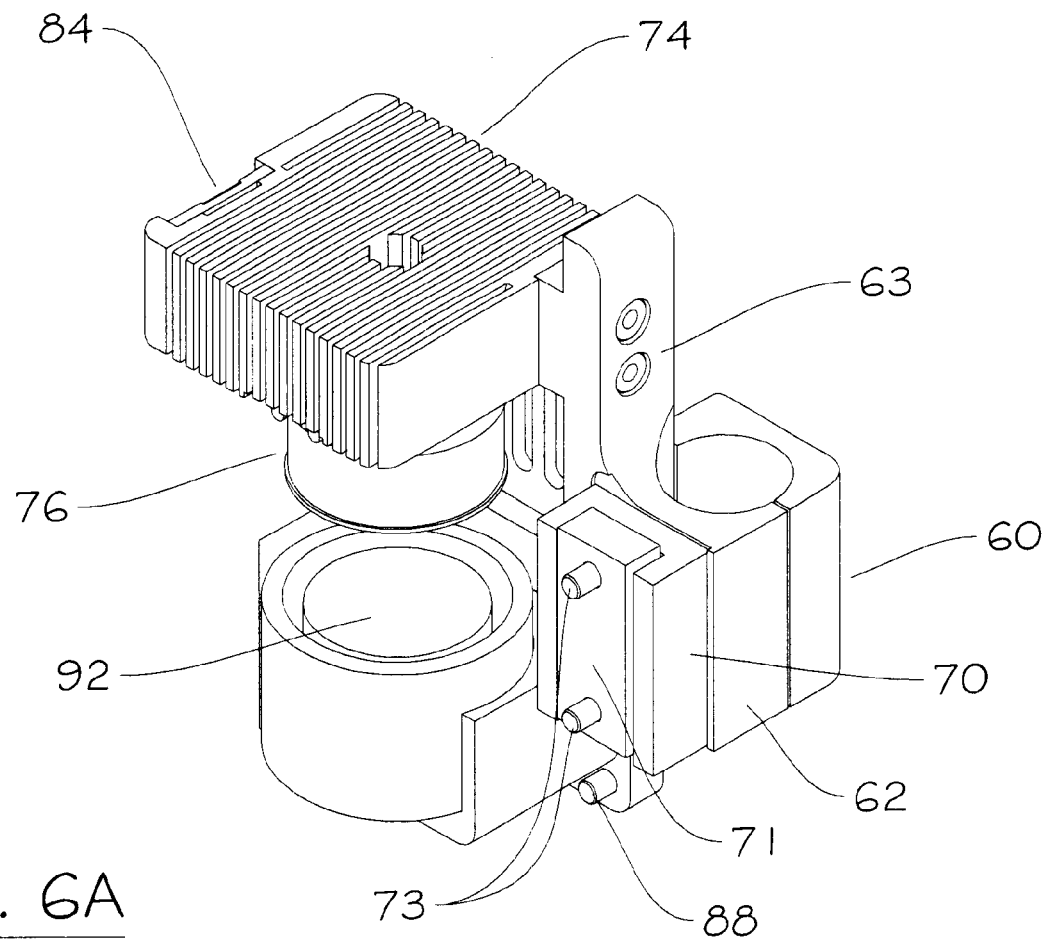
FIG. 6A shows the arrangement of a voicecoil of the slide assembly of FIG. 5 with a voicecoil magnet of the magnet assembly of FIG. 6.

The manner in which the voicecoil 76 is used to produce the reciprocal movement of the ultrasonic actuator 5 and the ultrasonic horn 48 connected thereto towards and away from the plastic sheet 30 (of FIG. 1) will be explained following a description of the magnet assembly 8 of FIG. 6 of the drawings. The magnet assembly 8 of FIG. 6 cooperates with the slide assembly 7 of FIG. 5 and the voicecoil 76 thereof to cause the up and down reciprocal movements of the ultrasonic actuator 5 that is coupled to slide assembly 7. The magnet assembly 8 includes a magnet mounting plate 86. A suitable set of fasteners 88 are provided to attached the mounting plate 86 to the front of the main housing 3 of the antenna wire embedding system 1 (best shown in FIG. 2). The magnet mounting plate 86 has a series of air holes 89 formed therein to provide ventilation for the heatsink 74 and the voicecoil 76 of the slide assembly 7 of FIG. 5. Projecting from the magnet mounting plate 86 is a magnet cradle 90. Seated within the cradle 90 is the stationary voicecoil magnet 92. Mounting plate 86 holds the voicecoil magnet 92 within the lower compartment (designated 28 in FIG. 3) of the main housing 3 in spaced alignment below the voicecoil 76 of slide assembly 7. The spaced alignment of the voicecoil 76 of the reciprocating slide assembly 7 and the stationary voicecoil magnet 92 of magnet assembly 8 is shown in FIG. 6A of the drawings.

The magnet assembly 8 also includes a free floating coil spring 94 that is positioned within the magnet cradle 90 alongside the voicecoil magnet 92 to cooperate with the top and bottom clamp shells 60 and 62 of the slide assembly 7 of FIG. 5 to set the at rest position of the ultrasonic actuator 5 when the system 1 is initialized or when the ultrasonic actuator 5 is spaced at its uppermost position above the plastic sheet 30. That is to say, the spring 94 is normally expanded so as to push on the slide assembly 7 and bias the clamp shells 60 and 62 and the ultrasonic actuator 5 away from the plastic sheet 30. Thus, no downward pushing forces are applied to the ultrasonic actuator 5 and the ultrasonic horn 48 thereof is moved out of contact with the plastic card 32. However, the spring 94 will be compressed to store energy when the ultrasonic actuator 5 is pushed downwardly by the slide assembly 7 towards the plastic sheet 30 and the horn 48 is correspondingly moved into contact therewith.

More particularly, the free floating spring 94 surrounds a screw threaded mounting post 96. One end of the mounting post 96 is embedded in a rotatable thumbwheel 97. The thumbwheel 97 is manually accessible through an access window 98 formed in the magnet mounting plate 86 (best shown in FIG. 2). The opposite end of mounting post 96, which has screw threads extending therearound, is received through a correspondingly screw threaded nut 99 upon which the spring 94 is seated. A pin 100 projects from the threaded nut 99 so as to be manually accessible through a vertically extending slot 101 in the magnet mounting plate 86 (also best shown in FIG. 2). A Teflon washer 102 is bonded to the bottom of the thumbwheel 97 to reduce wear during rotation.

A rotation of the thumbwheel 97 at access window 98 is imparted to the mounting post 96 connected to thumbwheel 97. Holding onto the pin 100 that extends through slot 101 during a rotation of the thumbwheel 97 causes the threaded nut 99 to ride axially along the threaded mounting post 96. Depending upon the direction in which the thumbwheel 97 is rotated, the threaded nut 99 will be moved either towards the spring 94 (during which the spring is compressed) or away from the spring 94 (during which the spring will expand). The compression and expansion of the spring 94 applies corresponding pushing and releasing forces against the slide assembly 7 within which the ultrasonic actuator 5 is carried.

The interaction between the stationary voicecoil magnet 92 and the moveable (i.e. with slide assembly 7) voicecoil 76 to produce the reciprocal up and down movements of ultrasonic actuator 5 is now explained while referring to FIG. 6A of the drawings. In operation, a DC current is supplied to the voicecoil 76 of slide assembly 7 of FIG. 5 such that voicecoil 76 becomes an electromagnet. The magnitude and direction of the DC current conducted by voicecoil 76 is controlled by the system control circuitry (designated 22 in FIG. 13) to establish the direction in which the ultrasonic actuator 5 will move relative to plastic sheet 30. When the magnetic polarity of the movable voicecoil 76 of slide assembly 7 and the stationary voicecoil magnet 92 of the magnet assembly 8 is opposite one another, a magnetic attraction is established to pull the voicecoil 76 and the slide assembly 7 towards the voicecoil magnet 92, whereby the slide 70 of slide assembly 7 will slide over rail 71 in a downward direction.

Accordingly, the top and bottom clamp shells 60 and 62 of slide assembly 7 and the ultrasonic actuator 5 that is retained therebetween are all moved in the downward direction. At the same time, the ultrasonic horn 48 of ultrasonic actuator 5 is moved towards the plastic sheet 30 to enable the tip 52 to contact the sheet for the purpose of burning a channel therein so that a wire antenna 36 can be installed in the manner illustrated in FIG. 1. The magnitude of the DC current that is conducted through the voicecoil 76 determines the exact position of the ultrasonic actuator 5 relative to the plastic sheet 30 and the force that is applied against the sheet by the tip 52 of ultrasonic horn 48.

Once a section of wire antenna 36 has been installed on a card 32 of plastic sheet 30, the direction of the DC current that is conducted by the voicecoil 76 is reversed, such that the magnetic polarity of the movable voicecoil 76 and the stationary voicecoil magnet 92 is now identical. A magnetic repelling force is established by which to push the voicecoil 76 and the slide assembly 7 away from the stationary voicecoil magnet 92. The slide 70 will now slide over rail 71 in an upward direction. Accordingly, the top and bottom clamp shells 60 and 62 of slide assembly 7 and the ultrasonic actuator 5 that is retained therebetween are correspondingly moved in the upward direction, whereby the ultrasonic horn 48 is moved away from the plastic sheet 30 to lift the tip 52 of horn 48 off the card 32.

It may be appreciated that the push-pull electromagnetic effect that is established by reversing the direction of the DC current through the voicecoil 76 causes the ultrasonic actuator 5 to be successively lowered to install a wire antenna 36 in a plastic card 32 of sheet 30 and then raised when it is necessary to jump over the wire turns of an antenna 36 or to install another wire antenna at a different card on the sheet.

FIG. 7 shows the optical reader 10 that cooperates with the optical scale 84 that is attached to optical mount 82 at one side of the heatsink 74 and movable with the slide assembly 7 of FIG. 5. The cooperation between the optical reader 10 and the optical scale 84 makes it possible to monitor the position of the ultrasonic actuator 5 relative to the plastic sheet 30 in which wire antennas 36 are embedded. The optical reader 10 includes a mount 108. A light responsive optical head 110 is housed within the mount 108. Both the optical (e.g. glass) scale 84 that moves with the slide assembly 7 of FIG. 5 and the optical head 110 of the stationary mount 108 are available from Renishaw, Inc. with offices in Illinois.

The mount 108 of optical reader 10 is attached inside the main housing 3 of wire embedding system 1 so that the optical head 110 is held in axial alignment with the optical scale 84 that moves with the slide assembly 7 (of FIG. 5) and the ultrasonic actuator 5 (of FIG. 4) so as to enable the optical head 110 to be responsive to the linear displacement of the position lines that are printed on the optical scale 84. In this regard, by knowing the position of the ultrasonic actuator 5 above the plastic sheet 30, information is available to determine whether the horn 48 of actuator 5 must be lifted higher above the plastic sheet 30 so as to be able to jump over an embedded wire antenna 36 (best shown in FIG. 1) and thereby avoid damage when moving to a different card 32 to install a new wire antenna therewithin.

The mount 108 of optical reader 10 is fixedly attached within the main housing 3 of system 1 by a set of fasteners 112 (also shown in FIG. 2). The fasteners 112 are tightened through respective coiled adjustment springs 114 by which the optical head 110 may be tuned with regard to the optical scale 84 that is read thereby. That is, the adjustment springs 114 enable the distance and angle of alignment between the optical head 110 and the optical scale 84 to be selectively adjusted to enable an accurate response to the moving position lines that are printed on the optical scale 84.

Figure 8:
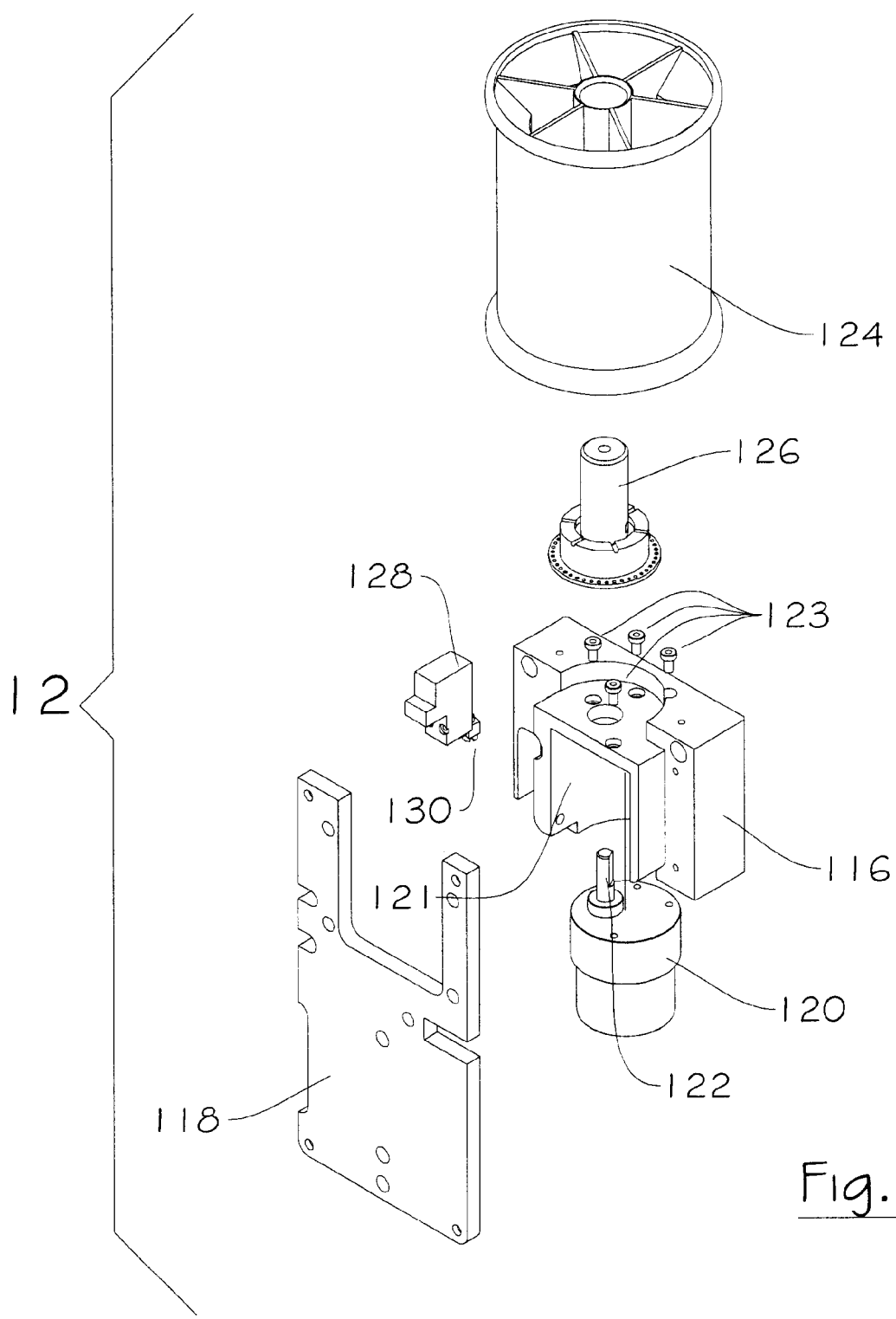
FIG. 8 is an exploded view of a spool assembly shown in FIG. 3.

FIG. 8 of the drawings shows the spool assembly 12 which dispenses the wire 136 that is to be embedded within the cards 32 of plastic sheet 30 of FIG. 1 when the ultrasonic horn 48 of ultrasonic actuator 5 moves into contact with the sheet. A motor block 116 is connected to a motor block backplate 118. A variable speed, reversible spool motor 120 having a spur gear drive is received in a motor cavity 121 of the motor block 116. Fasteners 123 attach motor 120 to motor block 116. Spool motor 120 includes a shaft 122 that is coupled to a wire spool 124 by way of a shaft encoder 126. In the assembled system configuration shown in FIG. 2, the spool 124 is seated above the spool motor block 116 atop the main housing 3. A rotation of the shaft 122 of spool motor 120 causes a corresponding rotation of the encoder 126 and the spool 124 in a clockwise or counterclockwise direction so that a supply of copper antenna wire (designated 136 in FIG. 2) is either dispensed (i.e. fed out) or retracted.

Figure 9:
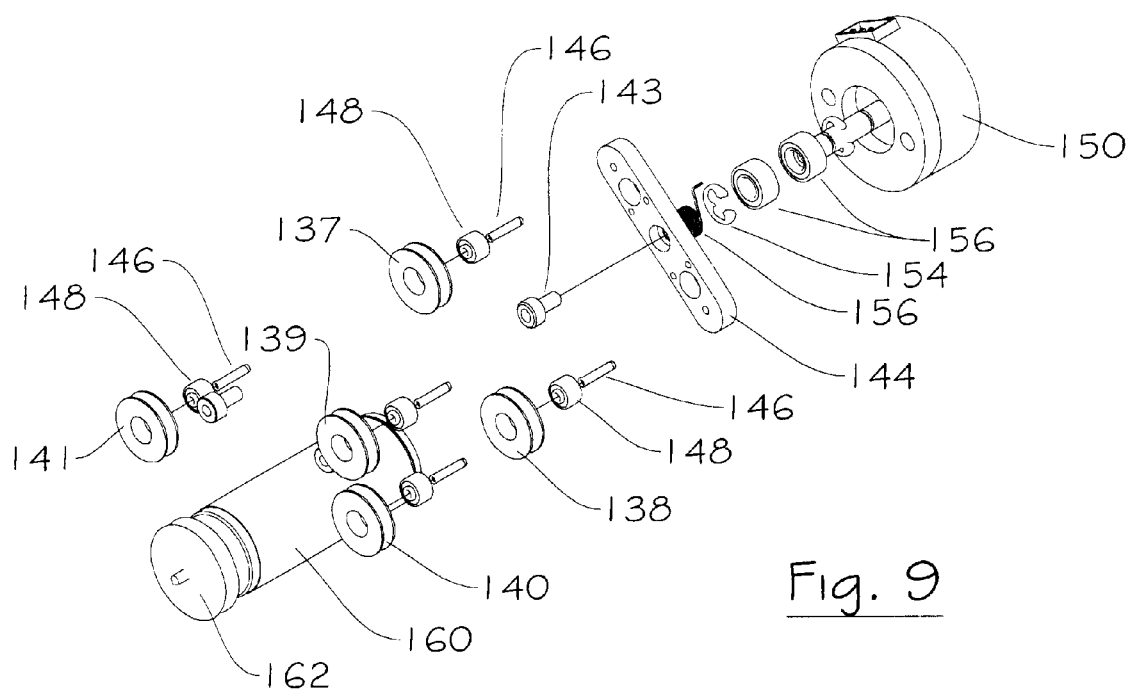
FIG. 9 is an exploded view of a swing/idler assembly shown in FIG. 3.

The shaft encoder 126 is responsive to the speed and direction of the shaft 122 of spool motor 120 and, correspondingly, the wire spool 124 that is driven thereby. The shaft encoder 126 of the spool assembly 12 of FIG. 8 and a soon to be described encoder 150 of the swing/idler assembly 14 of FIG. 9 provide information to the system control circuitry (designated 22 in FIG. 13). As will soon be explained, the speed and direction of the spool motor 120 is dependent upon the output of the encoders 126 (of FIG. 8) and 150 (of FIG. 9), whereby a length of copper wire will be either fed out from or retracted by the spool 124. As will also be explained, the speed and direction of the spool motor 120 is controlled to ensure a near zero tension on the antenna wire 136 being delivered from spool 124 to be embedded in the plastic sheet 30 of FIG. 1 so as to enable the high speed operation of the antenna wire embedding system 1.

The spool assembly 12 carries an air valve 128 that has a 3 millimeter barbed fitting 130 that is coupled to a source of air. The air valve 128 is adapted to control the flow of air from the barbed fitting 130 thereof to the quick disconnect fitting 44 that is connected to the top of the ultrasonic actuator 5 of FIG. 4 so that the body 42 of actuator 5 will be air cooled.

Figure 9A:
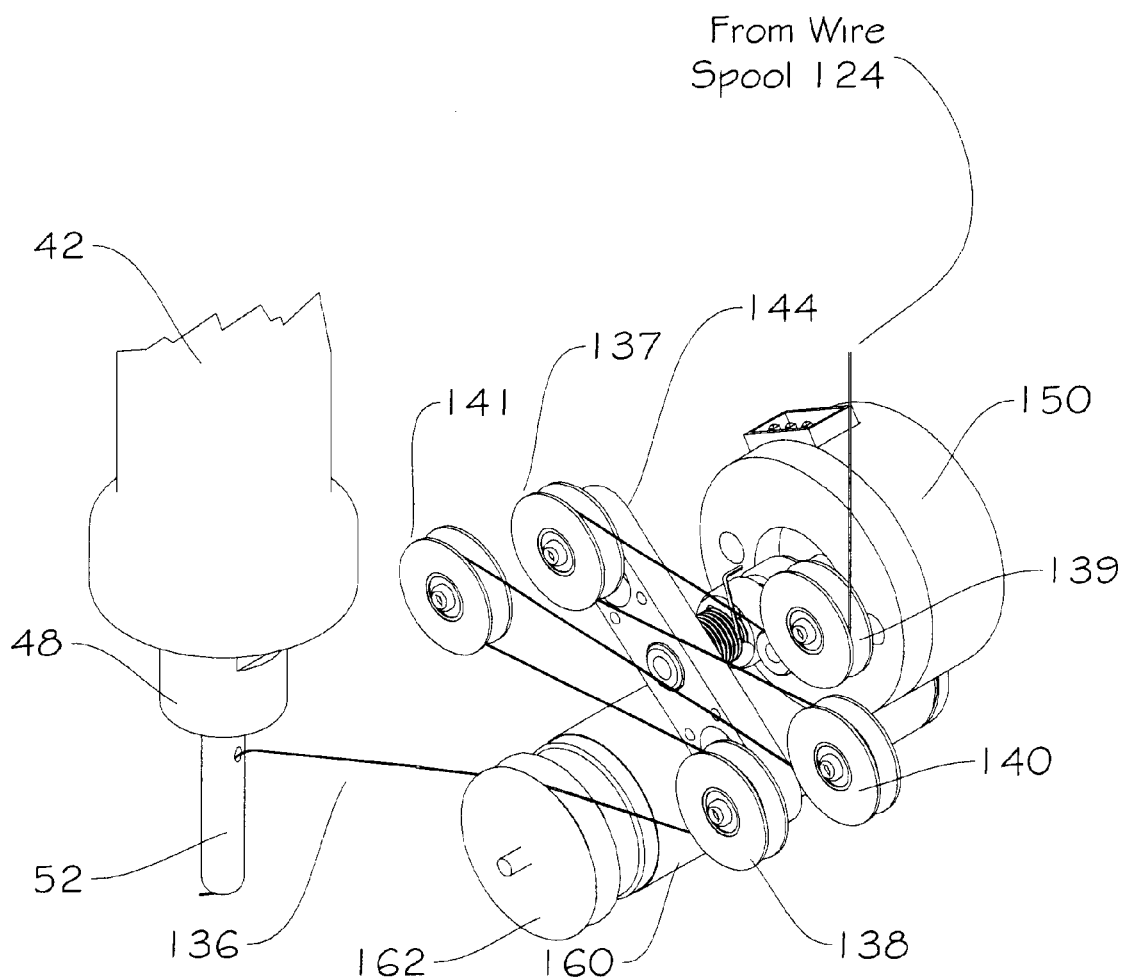
FIG. 9A shows the swing/idler assembly of FIG. 9 in the assembled configuration for feeding antenna wire to the ultrasonic actuator of FIG. 4.

FIGS. 9 and 9A of the drawings show the swing/idler assembly 14 which performs the important function of maintaining a near zero tension on the copper antenna wire (designated 136 in FIG. 9A) that is dispensed when the wire spool 124 of the spool assembly 12 of FIG. 8 rotates in a clockwise direction. The copper wire 136 is wound back and forth between a series of five idlers 137–141 that are located at the front of the main housing 3 of system 1. As is best shown in FIG. 1, a pair of idlers 137 and 138 are connected to opposite ends of a swing arm 144 by means of idler pins 146. The idler pins 146 are captured by idler bearings 148 that are received in a central opening formed in each idler 137 and 138. The swing arm 144 is connected to the aforementioned encoder 150 by a fastener 143 that is received through a torsional spring 152, an E-clip 154, a pair of bearings 156, and a shaft 158 that is coupled to the encoder 150. The torsional spring 152 biases the swing arm 144 in its at rest position with substantially no tension applied to the antenna wire 136.

The remaining three idlers 139–141 are connected, by respective idler pins 146 and idler bearings 148, to the front of the main housing 2 of system 1 to feed the antenna wire 136 from the wire guide channel 13 (of FIG. 2) to the tip 52 of the horn 48 of the ultrasonic actuator 5 (best shown in FIG. 9A). As was previously explained when referring to FIG. 4A, the antenna wire 136 is received at and threaded through the wire feed tube 54 of the tip 52 of horn 48 to be embedded directly into a channel that is burnt by tip 52 into a card 32 of the plastic sheet 30 so as to install a wire antenna 36.

Located between the last idler 138 of the swing/idler assembly 14 and the ultrasonic actuator 5 is a DC motor 160. A pulley idler 162 is rotated by the motor 160. The antenna wire 136 that is dispensed from the wire spool 124 (of FIG. 8) and wound around the series of idlers 137–141 is wrapped completely around the pulley idler 162 of motor 160 to be fed to the tip 52 of ultrasonic actuator 5. As an important feature of this invention, the motor 160 rotates the pulley idler 162 at a constant speed and in a single direction, even in the case where the antenna wire 136 is being retracted when the wire spool 124 rotates in a counter clockwise direction.

It has been found that the constant speed rotation of the pulley idler 162 reduces friction so as to advantageously enable a nearly zero tension in the antenna wire 136 to permit a smooth, continuous and high speed installation of wire antennas 36 in the plastic sheet 30. It has also been found that the maximum velocity of the antenna wire 136 being dispensed from spool 124 and fed to ultrasonic actuator 5 should be less than or equal to the tangential velocity of the pulley idler 162 that is rotated by motor 160.

Should increasing tension slow the feed of the antenna wire 136 to the ultrasonic actuator 5, the wire will be wrapped tighter around the pulley idler 162. However, the constant speed rotation of pulley idler 162 by motor 160 causes the antenna wire 136 to be fed out from the wire spool 124 at a faster rate until the tension in the wire is relieved. At this point, the antenna wire 136 will be wrapped less tightly around the pulley idler 162.

To achieve the foregoing, and as was previously described, the torsional spring 152 of FIG. 9 biases the swing arm 144 of swing/idler assembly 14 towards the at rest position shown in FIG. 1 when substantially no tension is applied to the antenna wire feed. In the event of an increase in tension along the antenna wire 136 being dispensed to the ultrasonic actuator 5, the swing arm 144 will experience a proportional rotation around fastener 143, and the torsional spring 152 will be compressed to store energy. The encoder 150 that is coupled to the swing arm 144 via encoder shaft 158 is responsive to the rotation of the swing arm 144 and, therefore, to an increase in the tension in the antenna wire 136.

Figure 13:
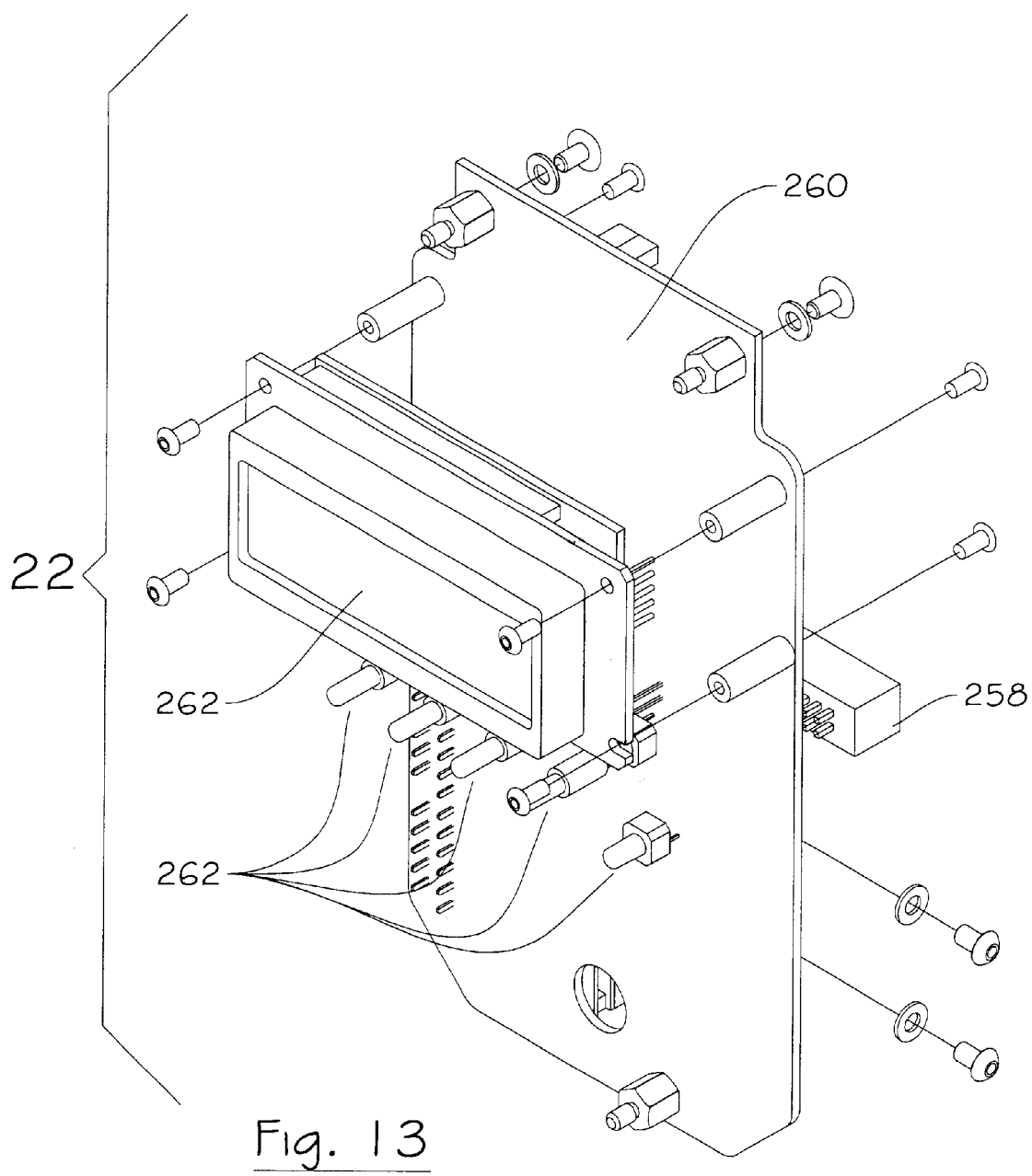
FIG. 13 is an exploded view of the control circuitry shown in FIG. 3.

In this regard, the encoder 150 sends information regarding the position of swing arm 144 to the system control circuitry 22 (of FIG. 13). The control circuitry of the antenna wire embedding system 1 receives information from both the encoder 150 of the swing/idler assembly 14 of FIG. 9 as well as the encoder 126 from the spool assembly 12 of FIG. 8. The information provided by encoders 126 and 150 is used to control the speed and direction of the spool motor 120 of spool assembly 12 and the wire spool 124 that is driven thereby.

Accordingly, the speed and direction of the wire spool 124 will be adjusted until the tension in the antenna wire 136 is eliminated. When such zero tension is achieved, the torsional spring 152 will expand and release its stored energy, whereby to cause the swing arm 144 of swing/idler assembly 14 to return to its at rest (i.e. zero tension position) on the main housing 3 of the antenna wire embedding system 1.

FIG. 10 of the drawings shows the clamp assembly 16 which holds the antenna wire 136 as it leaves the pulley idler 162 of swing/idler assembly 16 for receipt by the ultrasonic horn 48 of the ultrasonic actuator 5 of FIG. 4. The clamp assembly 16 includes a clamp body 166 having a pair of opposing nose ends 167 and 168 at the front of body 166 that are spaced from one another by a longitudinally extending gap 170. The nose ends 167 and 168 have axially aligned pin holes 171 and 172 formed therein to receive a pivot pin 174. Spaced above the clamp body 166 and extending within the gap 170 between the opposing nose ends 167 and 168 is a movable lower jaw 176. The movable lower jaw 176 also has a pin hole 178 to receive the pivot pin 174, so that in the assembled jaw configuration of FIG. 1, the lower jaw 176 is adapted to rotate within slot 170 and around pivot pin 174 so as to pivot towards and away from the fixed upper jaw (designated 177 in FIG. 1).

A pair of fasteners 180 and 181 extend through respective holes 182 and 183 in the clamp body 166 to attach the clamp assembly 16 to the main housing 3 of antenna wiring embedding system 1. A set screw 184 pushes on a coil spring 186 at an opening 188 in the front of clamp body 166. The set screw 184 urges the coil spring 186 through the opening 188 and into contact with the movable lower jaw 176 at a spring pocket 190 formed therein by which to exert an upward pushing force on the lower jaw 176. The lower jaw 176 is thereby urged to rotate around pivot pin 174 into a normally closed clamping position against the fixed upper jaw 177 so as to clamp the antenna wire 136 when it is to be cut following installation of an antenna wire 36 or when the wire embedding system 1 is idle (best shown in FIG. 2).

Upper and lower solenoid mounting holes 192 and 193 are axially aligned with and spaced above one another at the rear of the clamp body 166. Moved into alignment between the mounting holes 192 and 193 is a swivel jaw 194 at the rear of the movable lower jaw 176. A solenoid core 196 extends downwardly from a solenoid 198 that sits atop the upper mounting hole 192. The solenoid core 196 extends through the upper mounting hole 192 and the swivel jaw 194 of lower jaw 176. A threaded nut 200 is coupled to the solenoid core 196 below swivel jaw 194 to hold the solenoid 198 above the clamp body 166 and to couple control rod 196 to lower jaw 176.

When the solenoid 198 is energized by a DC current by the system control circuitry 22 of FIG. 13, the solenoid core 196 coupled to swivel jaw 194 is pulled upwardly, whereby the movable lower jaw 176 of jaw assembly 16 will rotate downwardly around pivot pin 174 and away from the fixed upper jaw 177 to release its grip on the antenna wire 136, whereupon spring 186 will be compressed to store energy. When the solenoid 198 is de-energized, the spring 186 will automatically expand and release its stored energy so as to force the lower jaw 176 to rotate upwardly and back into its at rest position in closed contact against the upper jaw 177 to once again clamp the antenna-wire 136.

Figure 11:
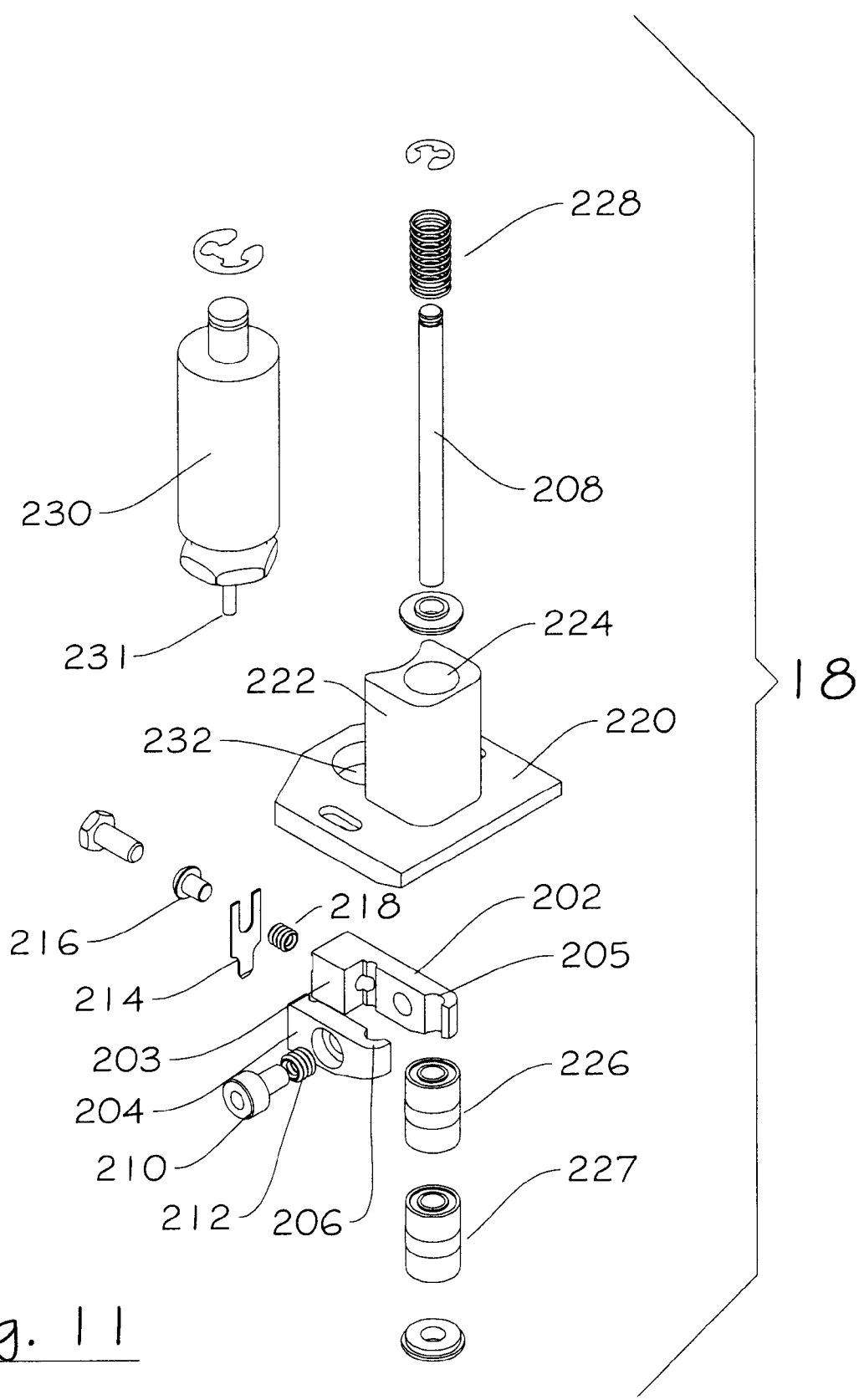
FIG. 11 is an exploded view of a wire cutter assembly shown in FIG. 3.

Following the installation of a wire antenna 36 at a plastic card 32, the antenna wire 136 that is clamped between the lower and upper jaws 176 and 177 is cut from its supply. FIG. 11 of the drawings shows the cutter assembly 18 by which the foregoing is accomplished. Cutter assembly 18 includes a split clamp having a cutter block 202 and a cutter clamp 204. Each of the cutter block and cutter clamp 202 and 204 has a notch 205 and 206 formed therein to capture an end of a push rod 208. The cutter block and cutter clamp 202 and 204 are connected together to retain the push rod 208 therebetween by means of a fastener 210 and a helicoil 212. A wire cutting blade 214 having a razor edge at the bottom thereof is connected to the back of the split clamp by means of a fastener 216 and a helicoil 218 attached to the cutter block 202.

The cutter assembly 18 includes a cutter mount for supporting the movement of the push rod 208 to advance the wire cutting blade 214 against the antenna wire 136 to be cut. The cutter mount has a base plate 220 and a housing 222 projecting upwardly therefrom. An opening 224 runs axially through housing 222 to receive the push rod 208 therethrough. The push rod 208 is surrounded by a pair of cylindrical bearings 226 and 227 that are located within the housing 222. The linear, reciprocal movement of the wire cutting blade 214 that is attached to the cutter block 202 is controlled by the push rod 208. In the assembled system configuration of FIG. 1, the wire cutting blade 214 is held below the base plate 220 of cutter assembly 18 and behind the horn 48 of ultrasonic actuator 5 so as to be in easy reach of the antenna wire 136 being installed thereby.

A coil spring 228 surrounds the push rod 208 of cutter assembly 18 to bias the rod 208 and the wire cutting blade 214 upwardly relative to the bottom of the base plate 220. A solenoid 230 is received in a solenoid mounting hole 232 that is formed through the base plate 220 of the cutter mount. Solenoid 230 includes a control rod 231 that is captured between the cutter block and cutter clamp 202 and 204 at an opening 203. When the solenoid 230 is energized by a DC current, the control rod 231 thereof is pushed downwardly below baseplate 220. The downward movement of control rod 231 causes the cutter block and cutter clamp 202 and 204, between which the control rod 231 is clamped, as well as the push rod 208 and the wire cutting blade 214 to also move in a downward direction from base plate 220 so as to cut off the antenna wire 136 following the installation of a wire antenna 36 as shown in FIG. 1. At the same time, the spring 228 surrounding push rod 208 will be compressed so as to store energy. When the solenoid 230 is de-energized, the spring 228 will automatically expand and release its stored energy to cause the push rod 208 and the wire cutting blade 214 to be pushed upwardly and away from the antenna wire 136 and towards the base plate 220 of the cutter mount so that a new wire antenna may be embedded within the plastic card 32.

Figure 12:
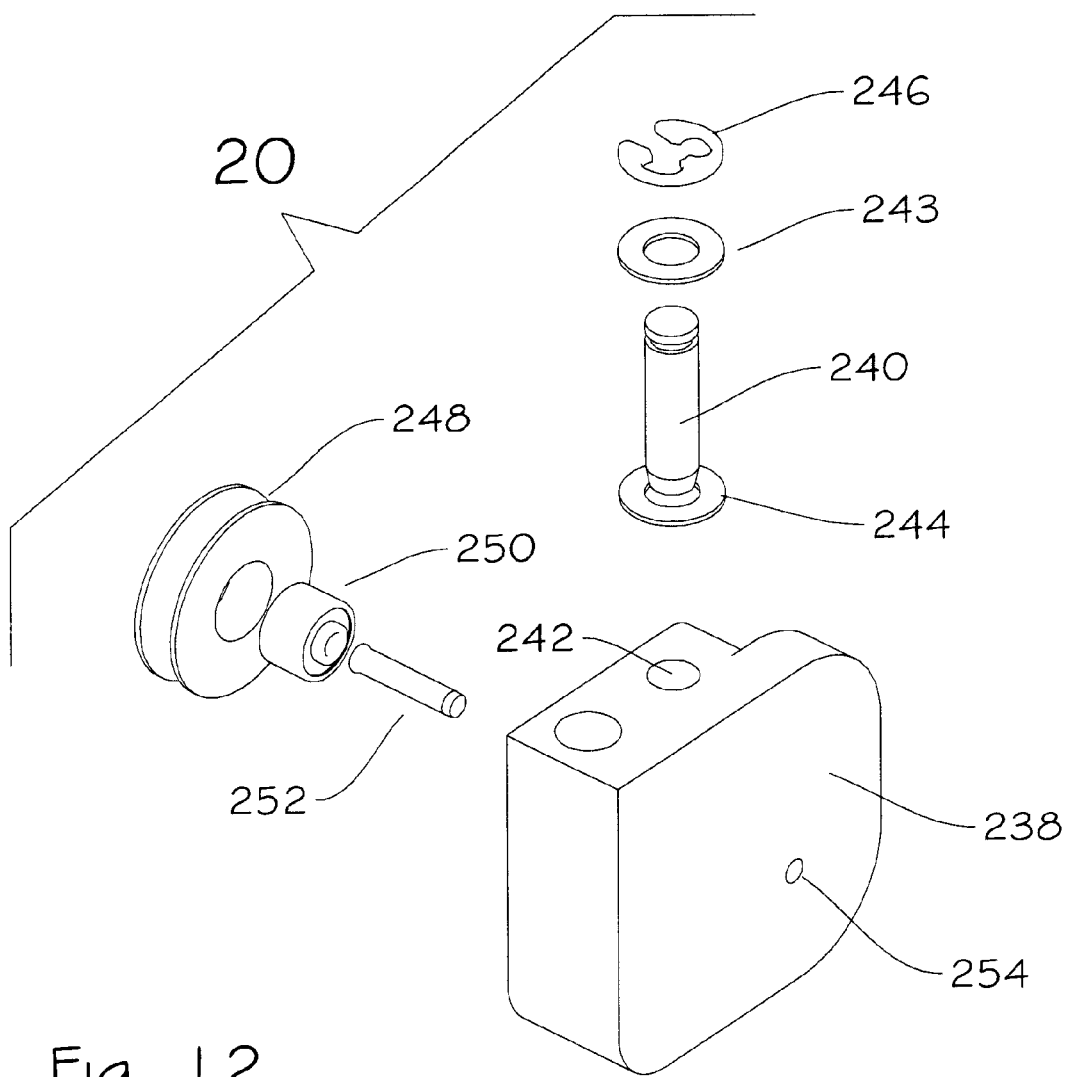
FIG. 12 is an exploded view of a wire dancer assembly shown in FIG. 3.

Referring to FIG. 12 of the drawings, there is shown the dancer assembly 20 for guiding the antenna wire 136 from the antenna wire spool 124 (of FIG. 8) into the wire guide channel 13 (of FIG. 2) that runs along the main housing 3 for receipt by the swing/idler assembly 14 (of FIGS. 9 and 9A). The dancer assembly 12 is suspended above the main housing 3 by means of a feed post 234 and a swivel mount 236 (best shown in FIG. 2). Thus, the dancer assembly 20 is adapted to "dance" above the main housing 3 so as to dampen oscillations and thereby provide the smooth flow of antenna wire 136 from the wire spool 124 to the wire guide channel 13.

The dancer assembly 20 includes a feed swivel block 238 that is attached to the main housing 3 by way of swivel mount 236 and feed post 234 so as to be held in spaced alignment above the wire guide channel 13. In particular, feed swivel block 238 is connected to the swivel mount 236 by a feed pin 240 that is received through a pin hole 242. The feed pin 240 is held in place by a pair of washers 243 and 244 and an E-clip 246. An idler wheel 248 is rotatably connected to the feed swivel block 238 at a recess formed therein (best shown in FIG. 2) by means of a cylindrical bearing 250 and an idler pin 252 that is received through a pin hole 254 formed in feed swivel block 238. Accordingly, antenna wire 136 from spool 124 is wound over the idler wheel 248 to be guided directly into the wire guide channel 13 of main housing 3 (best shown in FIGS. 2 and 3) with reduced friction and greater stability.

FIG. 13 of the drawings illustrates the control circuitry 22 for the antenna wire embedding system 1 of this invention. The system control circuitry 22 includes a printed circuit board 260 on which a plurality of preprogrammed electronic chips (not shown) are mounted to control the operation of the spool motor 120 of the spool assembly 12 (of FIG. 8) and the motor 160 of the swing/idler assembly 12 (of FIG. 9). Control circuitry 22 also processes the data received from the optical reader 10 (of FIG. 7) and the respective encoders 126 and 150 of spool assembly 12 and swing/idler assembly 14. The control circuitry 22 causes DC current to flow to the electromagnetic voice coil 76 of the slide assembly 7 (of FIG. 5) and the respective solenoids 198 and 230 of the clamp assembly 16 (of FIG. 10) and the cutter assembly 18 (of FIG. 11). A communication port 258 is included so that the chips on circuit board 260 can be interfaced with external peripheral devices (e.g. a personal computer).

Attached to the front of the printed circuit board 260 is a digital display 262. By way of example, the display 262 is a conventional liquid crystal display. The display 262 provides a visual indication of the status of the wire embedding system 1 to permit the initialization thereof and to monitor the position of the ultrasonic actuator 5 (of FIG. 4) and the force generated by moving the tip 52 of ultrasonic horn 48 into contact with the plastic sheet 30 of FIG. 1 to install a wire antenna 36. A series of push buttons 264 that are manually accessible at the front of main housing 3 (best shown in FIG. 2) may be selectively manipulated to enable the information shown on display 262 to be changed. The printed circuit board 260 is attached to the back of the main housing 3 so that the display 262 will be received within a window (designated 23 in FIG. 3) at the front of the main housing so as to be visible to users of the system 1.

For a relatively large plastic sheet 30 in which a large number of plastic smart cards 32, or the like, are to be manufactured in rows and columns, it may be desirable to network a plurality of the embedding systems 1 of this invention and mount the networked systems on a common robot arm (not shown) so that all of the systems can operate in tandem and be moved in unison along a looping path to wind antennas 36 around smart cards 32 (in the manner shown in FIG. 1). In this regard, and virtue of the present invention, wire antennas 32 may be continuously and efficiently embedded in sheet 30 at high speed and without binding as a consequence of undesirable tension that may occur in the wire feed path from the wire spool 124 to the ultrasonic actuator 5.

I claim:

1. Apparatus for embedding an electrical wire antenna in a non-electrically conductive substrate so as to communicate with an electronic chip mounted on the substrate, said apparatus comprising:
a source of antenna wire;
an ultrasonic actuator to receive a run of the antenna wire from said source thereof, said ultrasonic actuator having a tip that is adapted to oscillate at an ultrasonic frequency to melt the non-conductive substrate so that said run of antenna wire can be installed therewithin; and
an actuator positioning assembly coupled to said ultrasonic actuator for causing said actuator to move towards and away from the non-conductive substrate by which to enable the tip of said ultrasonic actuator to melt the substrate.

2. The apparatus recited in claim 1, wherein said ultrasonic actuator is connected to receive a supply of ultrasonic energy by which to cause the tip thereof to oscillate at said ultrasonic frequency so as to melt the non-conductive substrate whereby said run of antenna wire can be installed therewithin.

3. The apparatus recited in claim 1, wherein the tip of said ultrasonic actuator includes a wire feed channel extending therethrough, said run of antenna wire being fed from said source thereof through said wire feed channel to be installed within the non-conductive substrate when the non-conductive substrate is ultrasonically melted by said tip.

4. The apparatus recited in claim 3, wherein the tip of said ultrasonic actuator has a concave end for ultrasonically melting the non-conductive substrate, said wire feed channel extending through said tip to said concave end thereof.

5. The apparatus recited in claim 1, wherein said actuator positioning assembly is adapted to move towards and away from the non-conductive substrate for causing a corresponding movement of said ultrasonic actuator towards and away from the non-conductive substrate, said actuator positioning assembly including an electromagnetic voicecoil connected to receive a current of changing polarity, the movement of said actuator positioning assembly towards and away from the non-conductive substrate depending upon the polarity of the current received by said electromagnetic voicecoil.

6. The apparatus recited in claim 1, wherein said actuator positioning assembly is adapted to move towards and away from the non-conductive substrate for causing a corresponding movement of said ultrasonic actuator towards and away from the non-conductive substrate, said actuator positioning assembly including an electromagnetic voicecoil connected to receive a current, the movement of said actuator positioning assembly towards and away from the non-conductive substrate depending upon the magnitude of the current received by said electromagnetic voicecoil.

7. The apparatus recited in claim 1, wherein said actuator positioning assembly is adapted to move towards and away from the non-conductive substrate for causing a corresponding movement of said ultrasonic actuator towards and away from the non-conductive substrate, said actuator positioning assembly including an electromagnetic voicecoil connected to receive a current and a voicecoil magnet located in spaced proximity to said electromagnetic voicecoil, said electromagnetic voicecoil being attracted to and repelled from said voicecoil magnet to correspondingly cause said actuator positioning assembly and said ultrasonic actuator coupled thereto to move towards and away from the non-conductive substrate depending upon the magnitude and polarity of the current received by said electromagnetic voicecoil and the polarity of said voicecoil magnet.

8. The apparatus recited in claim 1, wherein said source of antenna wire is a wire dispensing spool having said antenna wire wound therearound, said apparatus further comprising a spool motor having a shaft coupled to said spool, said spool motor rotating the shaft thereof for causing a corresponding rotation of said spool, whereby the turn of antenna wire is dispensed from said spool and delivered to said ultrasonic actuator to be installed in the non-conductive substrate that has been ultrasonically melted by the tip of said ultrasonic actuator.

9. The apparatus recited in claim 8, further comprising a shaft encoder coupled to the shaft of said spool motor and providing an output that is indicative of the rotation of said motor shaft and said wire dispensing spool to which said motor shaft is coupled.

10. The apparatus recited in claim 9, further comprising an idler assembly positioned in a wire feed path running between said wire dispensing spool and said ultrasonic actuator, said idler assembly including a plurality of idler wheels over which said antenna wire is wound to minimize tension in the antenna wire delivered from said wire dispensing spool to said ultrasonic actuator.

11. The apparatus recited in claim 10, said idler assembly also including a rotatable pulley and a pulley motor coupled thereto, said pulley positioned in the wire feed path so that said antenna wire delivered to said ultrasonic actuator from said plurality of idler wheels is wound around said pulley, said pulley motor rotating said pulley at a constant speed and in a single direction.

12. The apparatus recited in claim 10, wherein the position of at least one of said plurality of idler wheels within said wire feed path is variable relative to another one of said plurality of idler wheels to correspondingly change the length of the antenna wire running along said wire feed path between said wire dispensing spool and said ultrasonic actuator so that a sufficient supply of antenna were is available along said wire feed path to minimize tension therein.

13. The apparatus recited in claim 12, said idler assembly also including an idler arm connected to the said one of said plurality of idler wheels over which said antenna wire is wound, said idler arm adapted to rotate in response to an increasing tension in the antenna wire running along said wire feed path between said wire dispensing spool and said ultrasonic actuator so as to cause a change in the position of said one idler wheel and a corresponding change in the length of the antenna wire running along said wire feed path.

14. The apparatus recited in claim 13, said idler assembly further comprising an idler arm encoder coupled to said idler arm and responsive to a rotation thereof, said idler arm encoder providing an output that is indicative of the rotation of said idler arm and the corresponding tension in the antenna wire running along said wire feed path.

15. The apparatus recited in claim 14, wherein the outputs of the shaft encoder coupled to the shaft of said spool motor and the idler arm encoder coupled to said idler arm are correlated with one another for generating a control signal by which to control the operation of said spool motor and the corresponding rotation of said wire dispensing spool so as to reduce tension in the antenna wire running along said wire feed path between said wire dispensing spool and said ultrasonic actuator.

16. Apparatus for embedding an electrical wire antenna in a non-electrically conductive substrate so as to communicate with an electronic chip mounted on the substrate, said apparatus comprising;

a source of antenna wire;

an ultrasonic actuator to receive antenna wire from said source thereof, said ultrasonic actuator having a tip that is adapted to oscillate at an ultrasonic frequency to melt the non-conductive substrate so that said antenna wire can be installed therewithin;

an actuator positioning assembly coupled to said ultrasonic actuator for causing said ultrasonic actuator to move towards and away form the non-conductive substrate by which to enable the tip of said ultrasonic actuator to melt the substrate; and an idler assembly positioned in a wire feed path between said source of antenna wire and said ultrasonic actuator, said idler assembly including a plurality of idler wheels over which the antenna wire is wound to minimize tension in the antenna wire being supplied from said source to said ultrasonic actuator.

17. The apparatus recited in claim 16, said idler assembly also including a rotatable pulley and a pulley motor coupled thereto, said pulley positioned in the wire feed path so that said antenna wire delivered to said ultrasonic actuator from said plurality of idler wheels is wound around said pulley, said pulley motor rotating said pulley at a constant speed and in a single direction.

18. The apparatus recited in claim 16, wherein the position of at least one of said plurality of idler wheels within said wire feed path is variable relative to another one of said plurality of idler wheels to correspondingly charge the length of the antenna wire along said wire feed path between said wire source and said ultrasonic actuator so that a sufficient supply of antenna wire is available along said wire feed path to minimize tension therein.

19. The apparatus recited in claim 18, idler assembly also including an idler arm connected to the said one of said plurality of idler wheels over which said antenna wire is wound, said idler arm adapted to rotate in response to an increasing tension in the antenna wire along said wire feed path between said wire source and said ultrasonic actuator so as to cause a change in the position of said one idler wheel and a corresponding change in the length of the antenna wire along said wire feed path.

20. The apparatus recited in claim 16, wherein the tip of said ultrasonic actuator has a concave end, said ultrasonic actuator connected to receive a supply of ultrasonic energy for causing said tip to oscillate at said ultrasonic frequency for ultrasonically melting the non-conductive substrate at said concave end thereof so that said antenna wire can be installed within the substrate.

21. The apparatus recited in claim 20, wherein the tip of said ultrasonic actuator includes a wire source, through said wire feed channel, and to said concave end to be installed within the non-conductive substrate when the non-conductive substrate is ultrasonically melted by said tip.

22. A method for embedding an electrical wire antenna in a non-electrically conductive substrate so as to communicate with an electronic chip mounted on the substrate, said method comprising the steps of:

supplying antenna wire from a source thereof to an actuator;

ultrasonically melting the non-conductive substrate to form a path therein within which the run of antenna wire is to be embedded; and moving said actuator towards and away from the non-conductive substrate during which the substrate is ultrasonically melted and the antenna wire is embedded within the path formed therein.

23. The method for embedding antenna wire recited in claim 22, including the additional step of supplying ultrasonic energy to said actuator for causing a tip thereof to oscillate at an ultrasonic frequency so that the non-conductive substrate is melted by said tip and the antenna wire is embedded within said path when said actuator moves towards and away from the substrate.

24. The method for embedding recited in claim 23, including the additional steps of forming a wire feed channel through the tip of said ultrasonic actuator and supplying the antenna wire from the source thereof through said wire feed channel to be embedded within the path formed in the non-conductive substrate when the non-conductive substrate is ultrasonically melted by the tip of said actuator and said actuator moves towards and away from the substrate.

* * * * *